United States Patent
Yamada et al.

(10) Patent No.: US 8,043,103 B2
(45) Date of Patent: Oct. 25, 2011

(54) ELECTRONIC COMPONENT CONNECTING APPARATUS, ELECTRONIC UNIT AND ELECTRONIC APPARATUS

(75) Inventors: Hiroshi Yamada, Kawasaki (JP); Tomomi Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 450 days.

(21) Appl. No.: 12/259,611

(22) Filed: Oct. 28, 2008

(65) Prior Publication Data
US 2009/0239394 A1 Sep. 24, 2009

(30) Foreign Application Priority Data
Mar. 19, 2008 (JP) ................................ 2008-071669

(51) Int. Cl.
*H01R 27/00* (2006.01)
(52) U.S. Cl. ....................... 439/219; 439/700
(58) Field of Classification Search ................... 439/53, 439/219, 482, 912, 66, 700
See application file for complete search history.

(56) References Cited

U.S. PATENT DOCUMENTS

| | | | | |
|---|---|---|---|---|
| 3,088,087 A | * | 4/1963 | Colten | 439/54 |
| 4,357,062 A | * | 11/1982 | Everett | 439/54 |
| 2007/0212900 A1 | * | 9/2007 | Crippen | 439/54 |

FOREIGN PATENT DOCUMENTS

| | | |
|---|---|---|
| JP | 5-322983 A | 12/1993 |
| JP | 2001-13208 A | 1/2001 |

* cited by examiner

*Primary Examiner* — Felix O Figueroa
(74) *Attorney, Agent, or Firm* — Arent Fox LLP

(57) ABSTRACT

An electronic component connecting apparatus includes an electronic component connecting section connected to an electronic component having terminals, a circuit board connecting section which is connected to a circuit board and which is electrically connects at least one of the terminals and the circuit board with each other, and a conduction section which electrically connects outside other than the circuit board and at least one of the terminals with each other. A current path between the electronic component and the external apparatus is shortened, and a heating value is suppressed. It is possible to prevent the apparatus from being damaged, and to increase the number of signal lines while preventing the circuit from becoming complicated.

10 Claims, 5 Drawing Sheets

ELECTRONIC COMPONENT CONNECTING APPARATUS, ELECTRONIC UNIT AND ELECTRONIC APPARATUS

CROSS-REFERENCE TO RELATED APPLICATIONS

This application is based upon and claims the benefit of priority of the prior Japanese Patent Application No. 2008-071669, filed on Mar. 19, 2008, the entire contents of which are incorporated herein by reference.

FIELD

The embodiments are related to an electronic component connecting apparatus which electrically connects an electronic component and a circuit board with each other, an electronic unit and an electronic apparatus.

BACKGROUND

Prior to shipment of semiconductor components such as LSIs and ICs, a semiconductor test of supplying power to the semiconductor component to take out a signal, and checking operation of the semiconductor component is carried out. In a semiconductor test, it is common to use a test machine having a socket board in which a power supply board and a signal leading board are superposed on each other, and a socket in which probes penetrate in a resin casing. In the semiconductor component and the socket board, signal leading electrode pads (signal pads, hereinafter) and power supply electrode pads (power pads, hereinafter) are arranged, the socket is mounted on the socket board. A semiconductor component is mounted on the socket so that electrode pads of the semiconductor component and the socket board are electrically connected to each other through a probe of the socket.

In recent years, leakage current is increased by finer design rules of a semiconductor component and power source frequency is increased by speedup tendency of a server apparatus or the like on which the semiconductor component is mounted. Accordingly, an amount of current in the semiconductor component at the time of operation is increased. The power consumption in the past was at most about 50 [W] but now it exceeds 100 [W]. In addition, data bus width of a server apparatus is expanded. Accordingly, a ratio of signal pads to the entire electrode pads is increased and a ratio of power pads is reduced. Thus, an amount of current flowing through one power probe which connects power pads of the semiconductor component and the socket board is abruptly increased. Since the probe is surrounded by a resin casing, it may not radiate heat easily, and if the heating value increases as the current increases, a pressure spring which presses the probe against the electrode pad may be damaged.

In this regard, it is common that a socket is provided with a blower fan or a heat sink to efficiently radiate heat generated by the probe. There is also proposed a technique in which an power supply board embedded with a signal leading line therein is provided with a through hole and plated with gold on the inner wall. A contact pin is inserted into the through hole, and an elastic material is pushed against the semiconductor component, thereby causing the board and the contact pin to contact directly with each other (see Japanese Patent Laid-open Application No. 2001-13208, for example). According to this technique, it is possible to shorten a current path between the power supply board and contact pin, reducing a resistance so that the heating value is suppressed.

According to the technique, however, since the signal leading line is embedded in the power supply board, if the number of signal leading lines is increased, the circuit becomes complicated. Thus, although this socket can be applied to a high temperature testing socket of a semiconductor component, there is a problem that it is difficult to use this socket as a normal socket which is mounted on a server apparatus and used for connecting a semiconductor component and an external component with each other.

SUMMARY

According to a first aspect of the present invention, an electronic component connecting apparatus includes:

an electronic component connecting section connected to an electronic component having plural terminals;

a circuit board connecting section which is connected to a circuit board and which electrically connects at least one of the plural terminals and the circuit board with each other; and a conduction section which electrically connects the outside other than the circuit board and the electronic component connecting apparatus with at least one of the terminals.

According to a second aspect of the present invention, an electronic unit includes:

an electronic component connecting section which connects to an electronic component having plural terminals;

a circuit board which is electrically connected to at least one of the plural terminals; and a conduction section which electrically connects outside other than the circuit board and at least one of the plural terminals.

According to a third aspect of the present invention, an electronic apparatus includes:

an electronic component having plural terminals;

an electronic component connecting section which is connected to the electronic component;

a circuit board which is electrically connected to at least one of the plural terminals;

a power source section which supplies power to the electronic component and the circuit board; and a conduction section which is disposed between the electronic component connecting section and the circuit board, and which supplies power from the power source section to the electronic component.

Additional objects and advantages of the invention will be set forth in part in the description which follows and, in part will be obvious from the description, or may be learned by practice of the present invention. The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF EMBODIMENT(S)

Specific embodiments will be explained with reference to the drawings.

Figure 1:
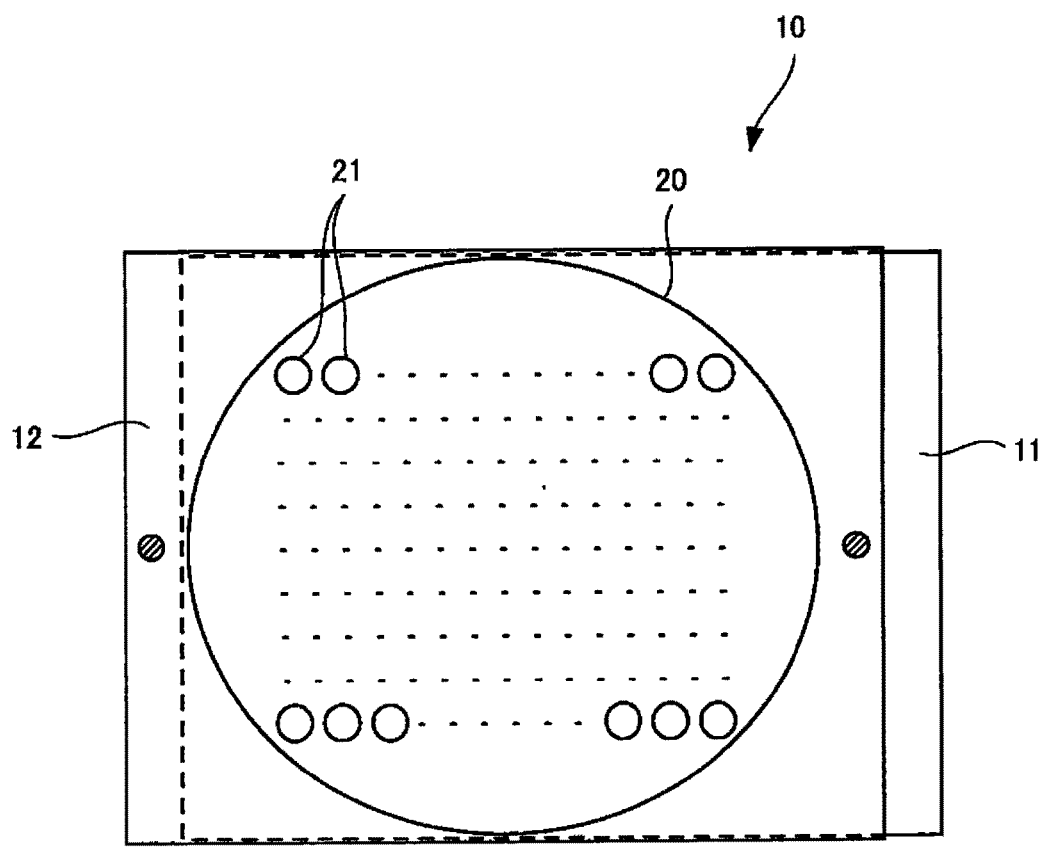
FIG. 1 is a schematic top view of a socket unit.

FIG. 1 is a schematic top view of a socket unit 10.

The socket unit 10 is for performing a semiconductor test of connecting an electronic device such as a semiconductor package and a peripheral device or an external circuit with each other, applying a power source voltage and a high frequency signal to the semiconductor package and checking an operation. As illustrated in FIG. 1, the socket unit 10 has pins 21 penetrating a circular socket casing 20 from its top surface. A voltage (VDD) side plate 11 and a ground (GND) side plate 12 for supplying power to the electronic device project from sides of the socket casing 20.

Figure 2:
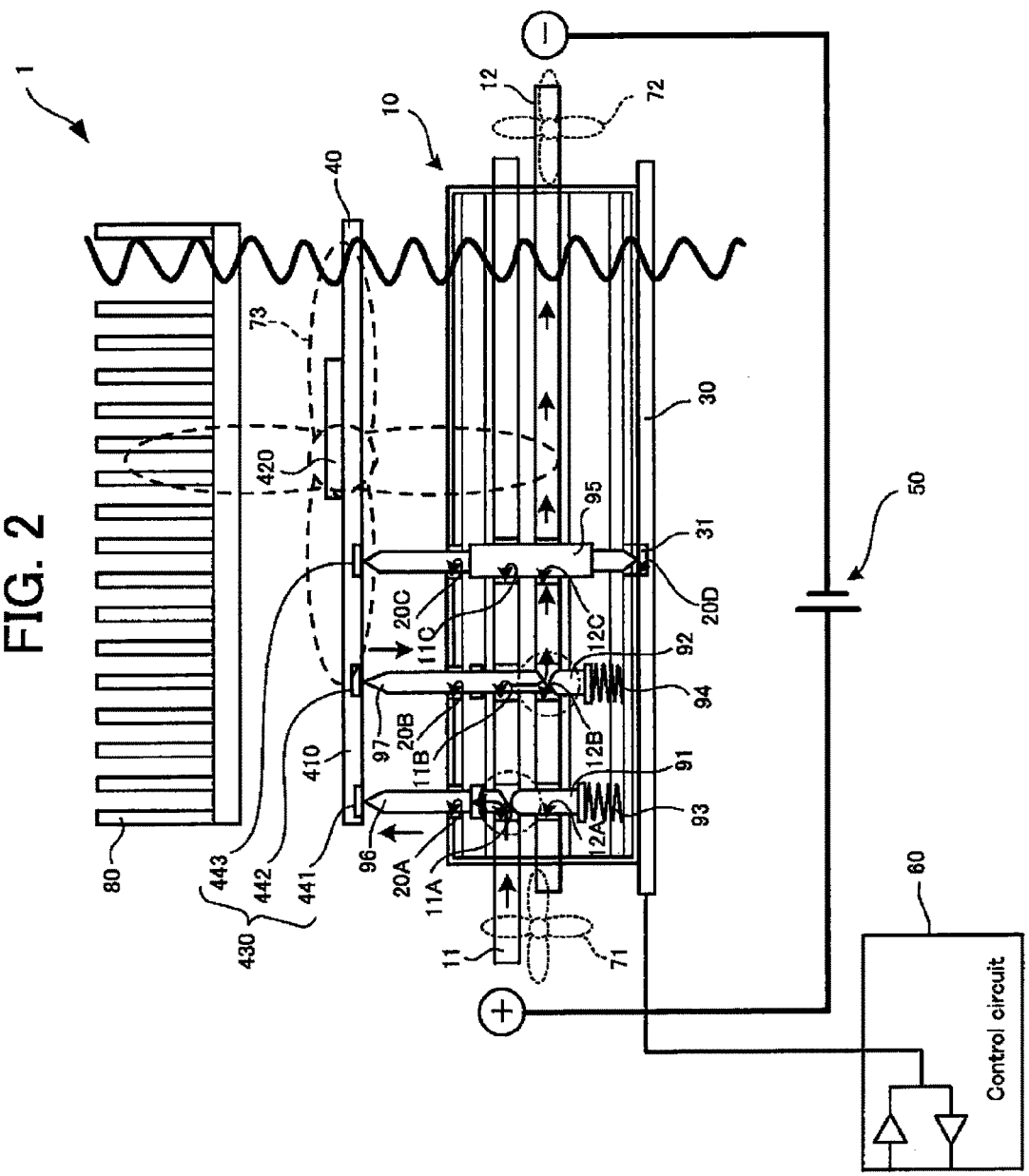
FIG. 2 is a side view of an electronic apparatus 1 including a socket unit.

FIG. 2 is a side view of an electronic apparatus 1 including the socket unit 10.

As illustrated in FIG. 2, the electronic apparatus 1 includes a signal board 30 for leading a signal, the socket unit 10 mounted on the signal board 30, a semiconductor package 40 mounted on the socket unit 10, a power source circuit 50 connected to a VDD plate 11 and a GND plate 12, a control circuit 60 connected to the signal board 30, blower fans 71, 72 and 73 provided above the semiconductor package 40 and aside of the VDD plate 11 and the GND plate 12, and a heat sink 80 for radiating heat in the electronic apparatus 1. The semiconductor package 40 is one example of the electronic component. The signal board 30 is one example of the circuit board. A combination of the voltage (VDD) side plate 11 and the ground (GND) side plate 12 is one example of the conduction section.

The semiconductor package 40 has a multiplayer board 410. An LSI 420 including a semiconductor device is mounted on a top surface of the multiplayer board 410. Electrode pads 430 to which the pins 21 of the socket unit 10 are connected are mounted on the under surface of the multiplayer board 410. The electrode pads 430 include a VDD pad 441 to be connected to the VDD plate 11, a GND pad 442 to be connected to the GND plate 12, and a signal pad 443 connected to the signal board 30. The electrode pads 430 of the semiconductor package 40 correspond to one example of the terminals described above.

The signal board 30 includes an electrode pad 31 to be electrically connected to the signal pad 443 at a position corresponding to the signal pad 443 of the semiconductor package 40 with the socket unit 10 interposed therebetween.

The VDD plate 11 of the socket unit 10 includes through holes 11A, 11B and 11C at positions corresponding to the VDD pad 441, the GND pad 442 and the signal pad 443 of the semiconductor package 40, respectively. The GND plate 12 includes through holes 12A, 12B and 12C at positions corresponding to the VDD pad 441, the GND pad 442 and the signal pad 443, respectively. The socket casing 20 is provided at its top surface with through holes 20A, 20B and 20C at positions corresponding to the VDD pad 441, the GND pad 442 and the signal pad 443, respectively. The socket casing 20 is also provided at its under surface with a through hole 20D at a position corresponding to the signal pad 443. Pressure pins 91 and 92 are fixed to the under surface of the socket casing 20. The pressure pins 91 and 92 project up to heights where the VDD plate 11 and the GND plate 12 are provided, and pressure springs 93 and 94 which forces the pressure pins 91 and 92 upward are mounted. The pressure pins 91 and 92 are made of non-metal material such as resin, and upper ends thereof are rounded.

The signal pad 443 of the semiconductor package 40 and the electrode pad 31 of the signal board 30 are connected to each other through a pogo pin 95 which penetrates the through holes 11C, 12C, 20C and 20D provided in the VDD plate 11, the GND plate 12 and the socket casing 20, respectively. A spring is incorporated in the pogo pin 95, and a tip end and rear end of the pogo pin are pressed by the signal pad 443 of the semiconductor package 40 and the electrode pad 31 of the signal board 30, respectively. The through holes 11C and 12C of the VDD plate 11 and the GND plate 12 through which the pogo pin 95 penetrates are formed larger than the outer diameter of the pogo pin 95. The pogo pin 95, the VDD plate 11 and the GND plate 12 are not in contact with each other and are insulated from each other. The pogo pin 95 is one example of the circuit board connecting section described above.

Plungers 96 and 97 supported by the pressure pins 91 and 92 from its lower side are connected to the VDD pad 441 and the GND pad 442 of the semiconductor package 40.

Explanation of FIG. 2 is suspended here, and connections between the plungers 96, and 97 and the VDD plate 11, the GND plate 12 will be explained in detail.

Figure 3:
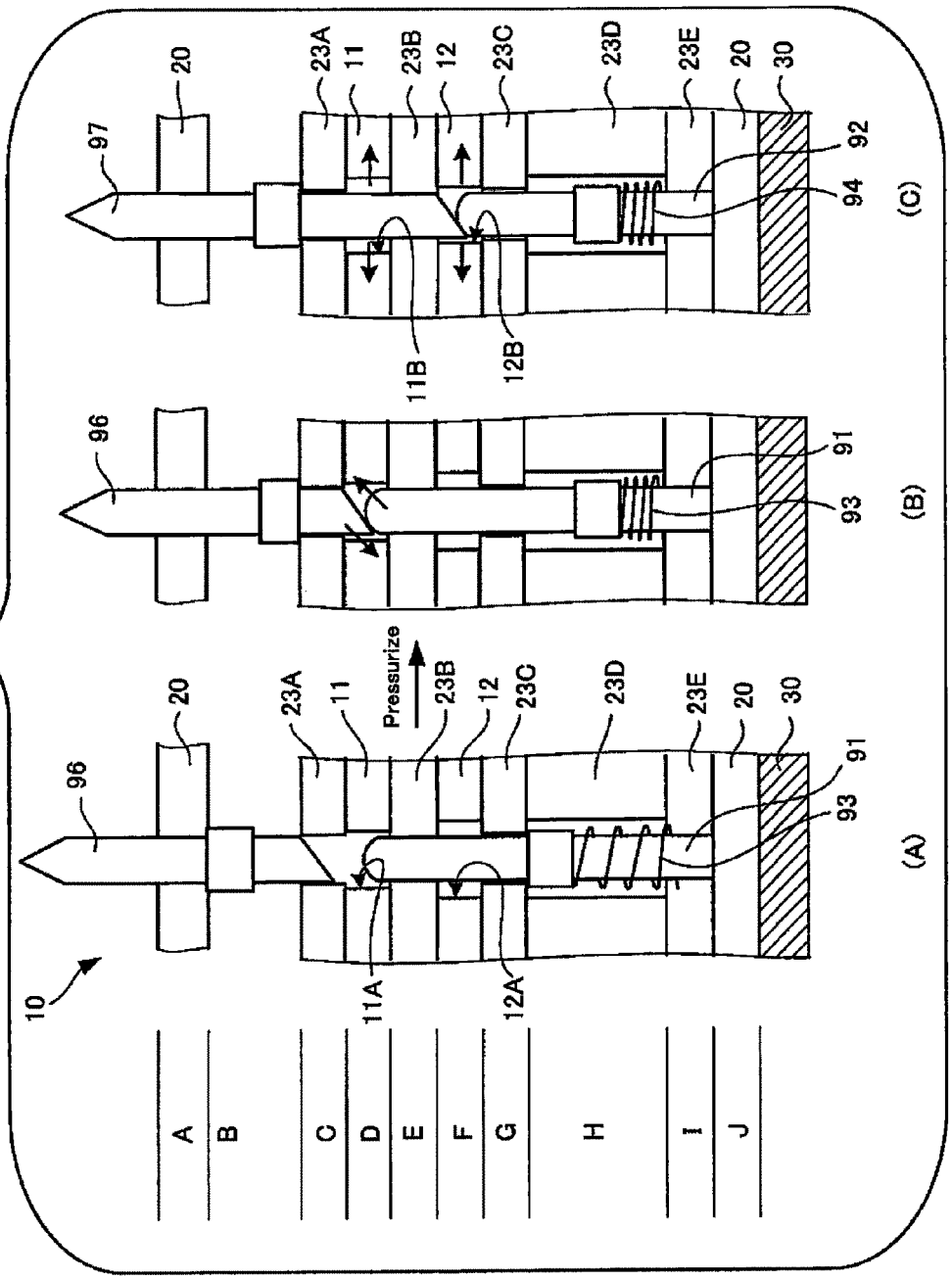
FIG. 3 is a diagram for explaining connection between a plunger, a VDD plate and a GND plate.

FIG. 3 is a diagram for explaining connections of the plungers 96, 97 and the VDD plate 11, the GND plate 12. FIGS. 4A-4J are top views at each position from A to J illustrated in FIG. 3.

As illustrated in part (A) of FIG. 3, the pressure pin 91 fixed to the position corresponding to the VDD pad 441 of the semiconductor package 40 projects to the height of the VDD plate 11, and the pressure spring 93 extends in a state where the pressure spring 93 is not in contact with the plunger 96.

Figure 4A:
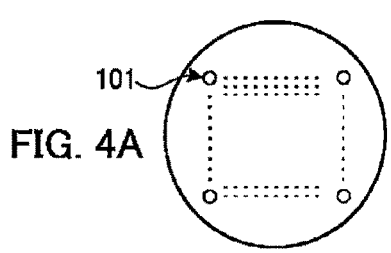
FIGS. 4A-4J are plan views from a position A to a position J illustrated in FIG. 3.
Figure 4F:
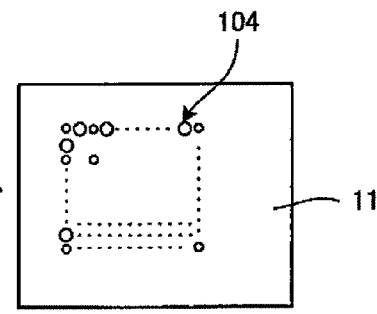
Figure 4B:
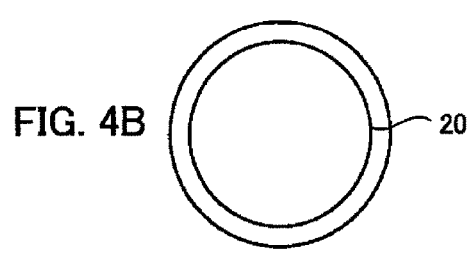
Figure 4G:
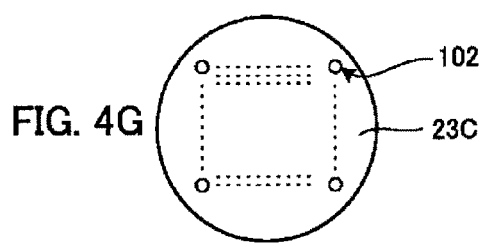
Figure 4C:
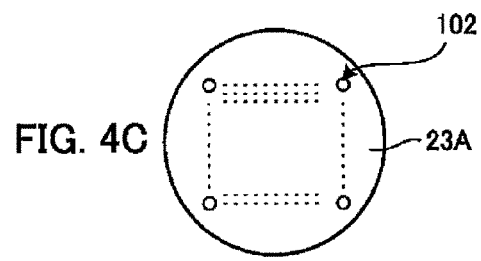
Figure 4H:
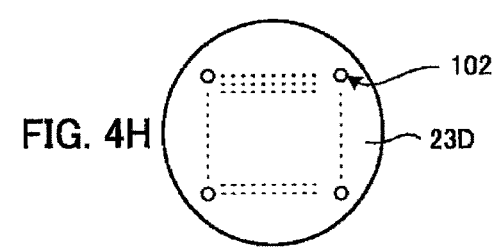
Figure 4D:
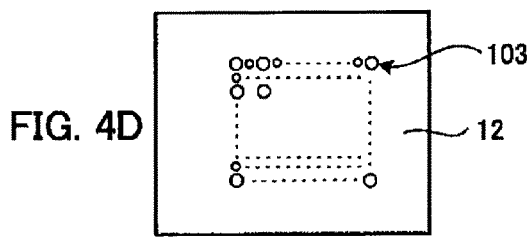
Figure 4I:
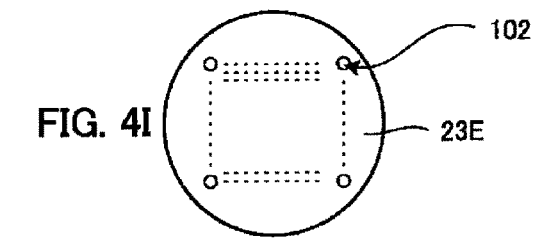
Figure 4E:
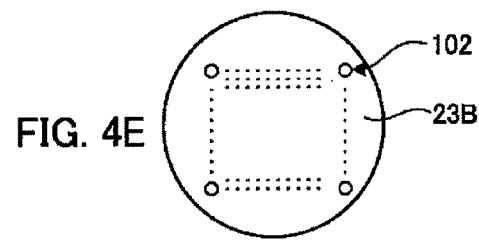
Figure 4J:
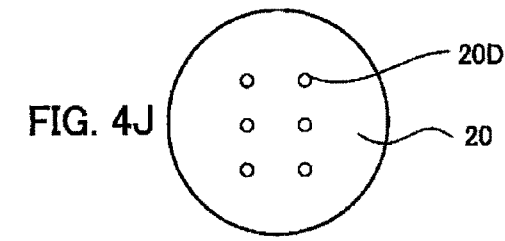

The socket unit 10 is mounted on the signal board 30. Resin guide plates 23A, 23B, 23C and 23D which support the plungers 96, 97 and the pressure pins 91, 92, and the VDD plate 11 and the GND plate 12 sandwiched between the guide plates 23A, 23B, 23C and 23D are disposed in the socket casing 20. As illustrated in FIG. 4A, throughholes 20A, 20B and 20C (these through holes are collectively illustrated as a through hole 101 in FIG. 4) in the top surface of the socket casing 20 at positions corresponding to the VDD pad 441, the GND pad 442 and the signal pad 443, respectively. As illustrated in FIG. 4B, the socket casing 20 has a hollow cylindrical shape. As illustrated in FIGS. 4C-4I, the guide plates 23A, 23B, 23C, 23D and 23E housed in the socket casing 20 are provided with through holes 102 at positions corresponding to the through holes 20A, 20B and 20C in the top surface of the socket casing 20, respectively. As illustrated in FIGS. 4D and 4F, the VDD plate 11 and the GND plate 12 are also provided with the through holes 11A, 11B, 11C, 12A, 12B and 12C (these through holes are collectively illustrated as through holes 103 and 104 in FIG. 4) at positions corresponding to the through holes 20A, 20B and 20C in the top surface of the socket casing 20, respectively. Described later, the through holes 11A, 11B, 11C, 12A, 12B and 12C formed in the VDD plate 11 and the GND plate 12 have different sizes depending on their positions. The socket casing 20 is provided at its under surface with the through hole 20D only at a position corresponding to the signal pad 443.

As illustrated in part (B) of FIG. 3, when the plunger 96 is inserted into the socket casing 20, the pressure spring 93 is contracted to force the pressure pin 91 upward, and the plunger 96 is pushed against the VDD pad 441 of the semiconductor package 40. At a position corresponding to the VDD pad 441, the through hole 11A of the VDD plate 11 has a smaller diameter than that of the through hole 12A provided in the GND plate 12, and the plunger 96 comes into contact with an inner wall of the through hole 11A of the VDD plate 11, and thus the plunger 96 is directly connected to the VDD plate 11. An top end of the pressure pin 91 is rounded, and the lower end of the plunger 96 is diagonally formed. Therefore, the plunger 96 slips diagonally by the pressure pin 91, and the plunger 96 comes into contact with the VDD plate 11 in a wide area and they can be reliably connected with each other.

As illustrated in part (C) of FIG. 3, the pressure pin 92 fixed at the position corresponding to the GND pad 442 of the semiconductor package 40 projects up to the height of the GND plate 12. When the plunger 97 is inserted, the pressure spring 94 is contracted to force the pressure pin 92 upward, and the plunger 97 is pushed against the GND pad 442 of the semiconductor package 40. At a position corresponding to the GND pad 442, the through hole 12B formed in the GND plate 12 has a smaller diameter than that of the through hole 11B of the VDD plate 11, the plunger 97 is not in contact with the through hole 11B of the VDD plate 11, and is in contact with an inner wall of the through hole 11B of the GND plate 12. That is, the plunger 97 is insulated from the VDD plate 11, and is directly connected to the GND plate 12.

Referring back to FIG. 2, explanation will be continued.

In the occasion of performing a semiconductor, when power is supplied from the power source circuit 50, current flows from the VDD plate 11 through the plunger 96 to the semiconductor package 40, and flows from the plunger 97 to the GND plate 12. A signal taken out from the semiconductor package 40 is sent through the pogo pin 95 to the signal board 30 and transmitted to the control circuit 60. In the electronic apparatus 1 illustrated in FIG. 2, current does not propagate to the pressure pins 91 and 92 and flows only to the plungers 96 and 97. Therefore, the current path between the VDD plate 11, the GND plate 12 and the semiconductor package 40 is shortened, the resistance is reduced so that the heating value can be suppressed and it is possible to prevent the pressure springs 93 and 94 from being damaged.

Since the semiconductor package 40 is mounted on the semiconductor package 40, the plungers 96 and 97 are pushed downward toward the pressure pins 91 and 92, the pressure pins 91 and 92 are forced upward by the pressure springs 93 and 94, bottom ends of the plungers 96 and 97 slip diagonally along the rounded shapes of the pressure pins 91 and 92, and the plungers 96 and 97 come in wide areas into contact with the inner walls of the through holes 11A and 12B of the VDD plate 11 and the GND plate 12. Therefore, resistances between the plungers 96, 97 and the VDD plate 11, the GND plate 12 can be reduced and the heating value can be suppressed.

In addition, the electronic apparatus 1, the VDD plate 11, the GND plate 12 and the signal board 30 are arranged in the height direction, and lengths of the plungers 96 and 97, the pogo pin 95 and the pressure pins 91 and 92 supporting the plungers 96 and 97 are adjusted in accordance with which one of the VDD plate 11, the GND plate 12 and the signal board 30 they are connected to. Therefore, it is possible to prevent the circuit from becoming complicated, and to increase the signal line, and it can be applied not only as a high frequency test socket, but also as a normal socket which connects the semiconductor package 40 and an external circuit.

Figure 5:
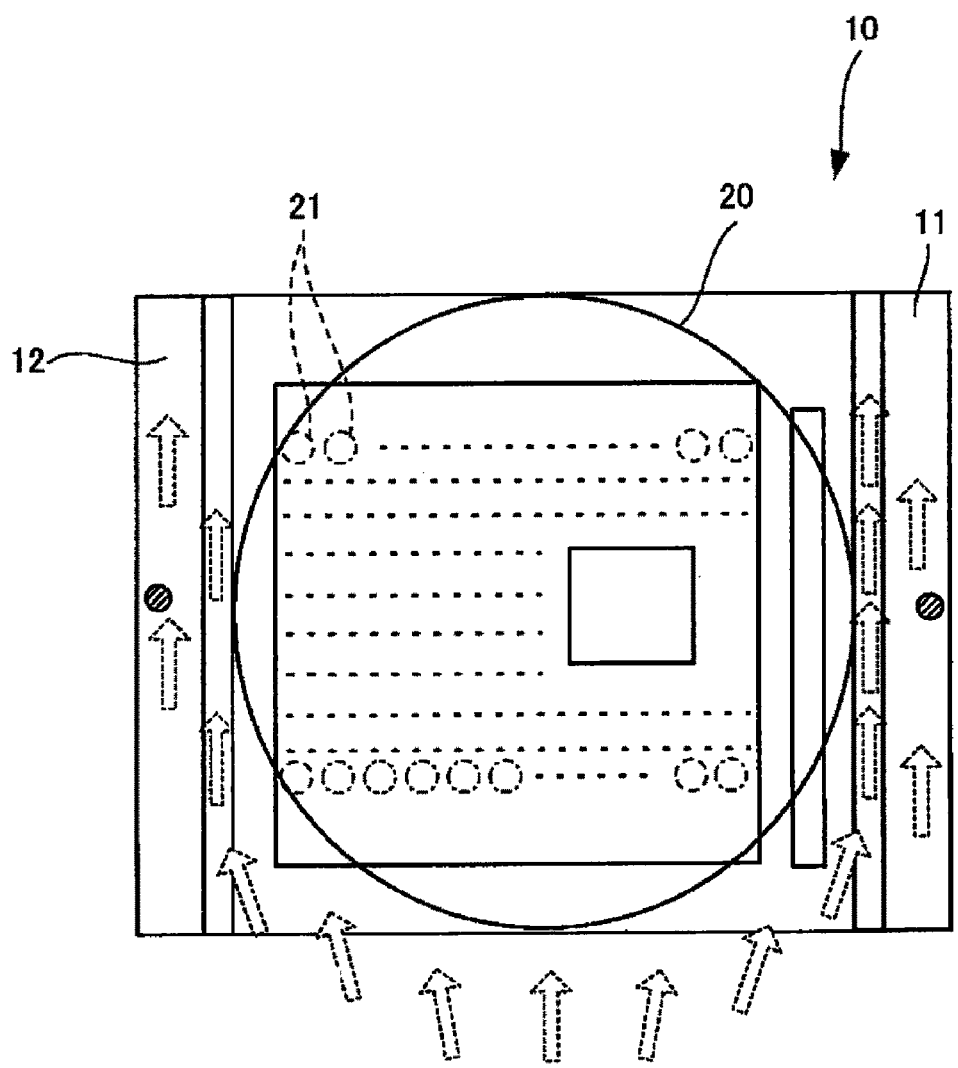
FIG. 5 is a diagram illustrating a flow of heat in the electronic apparatus.

FIG. 5 is a diagram illustrating a flow of heat in the electronic apparatus 1.

The VDD plate 11 and the GND plate 12 are used for supplying power and thus, they are made of conductive metal and the like. Further, as illustrated in FIG. 2, the VDD plate 11 and the GND plate 12 are directly connected to the plungers 96 and 97 which are heat sources. Heat generated by the plungers 96 and 97 is transmitted by the VDD plate 11 and the GND plate 12 having favorable thermal conductivity, and heat is radiated from the heat sink 80 by the blower fans 11 and 12 provided on the side of the VDD plate 11 and the GND plate 12. The plungers 96 and 97 are in contact with one of the VDD plate 11 and the GND plate 12, but since a gap is provided between the other one and the plungers 96 and 97, an air space is formed. Heat of the plungers 96 and 97 is also radiated by this air space.

As illustrated in FIG. 5, since the socket casing 20 is circular in shape, wind sent from the blower fan 73 flows on both sides along the edge of the socket casing 20 and transmitted to the top surfaces of the VDD plate 11 and the GND plate 12. According to the electronic apparatus 1, it is possible to suppress the heating value and to enhance the heat radiation efficiency. According to the conventional socket, a pressure spring is actually damaged by a heating value of the order of about 20 [W] to 50 [W], but according to the socket unit 10 of the embodiment, it is possible to prevent a pressure spring from the damage against a heating value of about current 4 [A] (flowing through one of the plungers 96 and 97)×voltage 1.00 [V]×100 (number of pieces of the plungers)=400 [W].

Here, although an example in which the socket unit of the specific embodiment of the electronic component connecting apparatus is utilized as the semiconductor testing socket is described above, the socket unit can also be applied to a normal socket which connects a semiconductor component and an external circuit with each other.

According to the electronic component connecting apparatus of the above-described embodiment, the electronic component and the circuit board are electrically connected to each other by connecting the circuit board connecting section and the signal circuit board, and the electronic component and the external apparatus are connected to each other in terms of power source by connecting the conduction section with the electronic component and also with power source device. Therefore, a current path between the electronic component and the external apparatus is shortened, a heating value is suppressed and it is possible to prevent the apparatus from being damaged and to prevent a circuit from becoming complicated so that a number of signal lines may be increased.

Further, according to the electronic unit of the above-described embodiment, it is possible to suppress the heating value, and to prevent the circuit from becoming complicated, and the electronic unit can be preferably applied as a socket for connecting the electronic component and an external circuit with each other.

Furthermore, according to the electronic apparatus of the above-described embodiment, it is possible to prevent the circuit from becoming complicated, to reduce the electrical resistance, and to suppress the heating value.

As described above, according to the electronic component connecting apparatus, the electronic unit and the electronic apparatus of the above-described embodiments, it is possible to prevent the circuit from becoming complicated, to reduce the electrical resistance, to suppress the heating value, and to efficiently radiate heat.

The turn of the embodiments isn't a showing the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic component connecting apparatus comprising:
    an electronic component connecting section connected to
        an electronic component having a plurality of terminals;

a circuit board connecting section which is connected to a circuit board and which electrically connects at least one of the plurality of terminals and the circuit board with each other;

a conduction section which electrically connects an external apparatus other than the circuit board and the electronic component connecting apparatus with at least one of the plurality of terminals;

a first pin made of metal having one end facing a connection terminal;

a second pin made of resin that extends toward the other end of the first pin opposite to the one end of the first pin, in the direction of the axis of the first pin; and a spring which forces the second pin in a direction in which the second pin is pressed against the first pin so that the first pin is pressed against the connection terminal, wherein the conduction section is contacted with the first pin pressed against the connection terminal, so as to be electrically connected with the connection terminal.

2. The electronic component connecting apparatus according to claim 1, wherein the conduction section supplies a power to the electronic component for driving the electronic component 3. The electronic component connecting apparatus according to claim 1, wherein the conduction section transmits heat generated by the electronic component to the outside.

4. The electronic component connecting apparatus according to claim 1, wherein the conduction section electrically connects to the terminal in accordance with connection between the electronic component connecting section and the electronic component.

5. An electronic unit comprising:

an electronic component connecting section which connects to an electronic component having a plurality of terminals;

a circuit board which is electrically connected to at least one of the plurality of terminals;

a conduction section which electrically connects an external apparatus other than the circuit board and at least one of the plurality of terminals;

a first pin made of metal having one end facing a connection terminal;

a second pin made of resin that extends toward the other end of the first pin opposite to the one end of the first pin, in the direction of the axis of the first pin; and a spring which forces the second pin in a direction in which the second pin is pressed against the first pin so that the first pin is pressed against the connection terminal, wherein the conduction section is contacted with the first pin pressed against the connection terminal, so as to be electrically connected with the connection terminal.

6. The electronic unit according to claim 5, wherein the conduction section supplies a power to the electronic component for driving the electronic component.

7. The electronic unit according to claim 5, wherein the conduction section transmits heat generated by the electronic component to the outside.

8. The electronic unit according to claim 5, wherein the conduction section electrically connects to the terminal in accordance with connection between the electronic component connecting section and the electronic component.

9. An electronic apparatus comprising:

an electronic component having a plurality of terminals;

an electronic component connecting section which is connected to the electronic component;

a circuit board which is electrically connected to at least one of the plurality of terminals;

a power source section which supplies power to the electronic component and the circuit board;

a conduction section which is disposed between the electronic component connecting section and the circuit board, and which supplies power from the power source section to the electronic component;

a first pin made of metal having one end facing a connection terminal;

a second pin made of resin that extends toward the other end of the first pin opposite to the one end of the first pin, in the direction of the axis of the first pin; and a spring which forces the second pin in a direction in which the second pin is pressed against the first pin so that the first pin is pressed against the connection terminal, wherein the conduction section is contacted with the first pin pressed against the connection terminal, so as to be electrically connected with the connection terminal.

10. The electronic apparatus according to claim 9, wherein the conduction section transmits heat generated by the electronic component.

* * * * *